(12) United States Patent
Wang et al.

(10) Patent No.: US 12,301,170 B2
(45) Date of Patent: May 13, 2025

(54) DOHERTY TRANSCEIVER INTERFACE

(71) Applicant: QUALCOMM INCORPORATED, San Diego, CA (US)

(72) Inventors: Chuan Wang, San Diego, CA (US); Li Liu, San Diego, CA (US); Bhushan Shanti Asuri, San Diego, CA (US); Gurkanwal Singh Sahota, San Diego, CA (US); Abdellatif Bellaouar, Richardson, TX (US); Vinod Panikkath, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 879 days.

(21) Appl. No.: 17/481,559

(22) Filed: Sep. 22, 2021

(65) Prior Publication Data

US 2023/0091253 A1    Mar. 23, 2023

(51) Int. Cl.
*H03F 1/02* (2006.01)
*H03F 3/21* (2006.01)
(Continued)

(52) U.S. Cl.
CPC ........... *H03F 1/0288* (2013.01); *H03F 3/211* (2013.01); *H03F 3/245* (2013.01); *H04B 1/405* (2013.01); *H03F 2200/451* (2013.01)

(58) Field of Classification Search
CPC ........ H03F 1/0288; H03F 3/211; H03F 3/245; H04B 1/405
(Continued)

(56) References Cited

U.S. PATENT DOCUMENTS 5,884,143 A * 3/1999 Wolkstein ............... H03F 1/526
 333/17.1
6,285,251 B1 * 9/2001 Dent ..................... H03F 1/0294
 330/127
(Continued)

FOREIGN PATENT DOCUMENTS

WO    2019164053 A1    8/2019

OTHER PUBLICATIONS

International Search Report and Written Opinion—PCT/US2022/041959—ISA/EPO—Mar. 13, 2023.
(Continued)

*Primary Examiner* — Patricia T Nguyen
(74) *Attorney, Agent, or Firm* — Smith Tempel Blaha LLC/Qualcomm Incorporated

(57) ABSTRACT

A transceiver interface for a phased array element includes a first magnetic circuit having a primary coil and a secondary coil, a second magnetic circuit having a primary coil, a secondary coil and a tertiary coil, a main amplifier path and an auxiliary amplifier path, the main amplifier path coupled to the primary coil of the second magnetic circuit and configured to receive a quadrature signal, the main amplifier path configured to provide a quadrature output signal, the auxiliary amplifier path coupled to the primary coil of the first magnetic circuit and configured to receive an in-phase signal, the auxiliary amplifier path configured to provide an in-phase output signal, a selectable output circuit configured to selectively combine the in-phase output signal and the quadrature output signal, and a low noise amplifier (LNA) coupled to the tertiary coil of the second magnetic circuit.

17 Claims, 9 Drawing Sheets

(51) Int. Cl.
*H03F 3/24* (2006.01)
*H04B 1/405* (2015.01)

(58) Field of Classification Search
USPC ...................................................... 330/124 R
See application file for complete search history.

(56) References Cited

U.S. PATENT DOCUMENTS

| | | | |
|---|---|---|---|
| 9,660,345 B1 | 5/2017 | Gu et al. | |
| 11,316,489 B2* | 4/2022 | Patel ...................... | H03K 5/026 |
| 2008/0122542 A1 | 5/2008 | Bowles et al. | |
| 2011/0281531 A1 | 11/2011 | Chiang et al. | |
| 2013/0088391 A1* | 4/2013 | Corman ............. | H04B 7/18515 |
| | | | 342/365 |
| 2013/0294777 A1* | 11/2013 | Willner ................... | H04J 14/00 |
| | | | 398/78 |
| 2014/0118070 A1* | 5/2014 | Wilson ................... | H03F 3/601 |
| | | | 330/295 |
| 2015/0200690 A1* | 7/2015 | Youssef ................... | H04L 5/14 |
| | | | 455/73 |
| 2016/0218682 A1* | 7/2016 | Lyalin ....................... | H03F 3/19 |
| 2017/0019071 A1 | 1/2017 | Kobayashi et al. | |
| 2018/0248571 A1* | 8/2018 | Wang ....................... | H04B 1/04 |
| 2021/0105047 A1 | 4/2021 | Mishra et al. | |

OTHER PUBLICATIONS

Partial International Search Report—PCT/US2022/041959—ISA/EPO—Dec. 13, 2022.

* cited by examiner

DOHERTY TRANSCEIVER INTERFACE

FIELD

The present disclosure relates generally to electronics, and more specifically to radio frequency (RF) transmitters and receivers.

BACKGROUND

Wireless communication devices and technologies are becoming ever more prevalent, as are communication devices that operate at millimeter-wave (mmW) frequencies. Wireless communication devices generally transmit and/or receive communication signals.

A communication signal is typically processed by a variety of different components and circuits. In some modern communication systems, a communication beam may be formed and steered in one or more directions. One type of beam steering system uses what is referred to as phased array, or phased array antenna system. A phased array may use a number of different elements and antennas where each element may process a transmit and/or receive signal that is offset in phase by some amount, leading to different elements of a phased array system processing slightly phase-shifted versions of a transmit and/or a receive signal. A phased array system may produce narrow, steerable, high power communication beams. A phased array antenna system may also form part of a massive multiple-input, multiple-output (MIMO) system.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a transceiver interface for a phased array element including a first magnetic circuit having a primary coil and a secondary coil, a second magnetic circuit having a primary coil, a secondary coil and a tertiary coil, a main amplifier path and an auxiliary amplifier path, the main amplifier path coupled to the primary coil of the second magnetic circuit and configured to receive a quadrature signal, the main amplifier path configured to provide a quadrature output signal, the auxiliary amplifier path coupled to the primary coil of the first magnetic circuit and configured to receive an in-phase signal, the auxiliary amplifier path configured to provide an in-phase output signal, a selectable output circuit configured to selectively combine the in-phase output signal and the quadrature output signal, and a low noise amplifier (LNA) coupled to the tertiary coil of the second magnetic circuit.

Another aspect of the disclosure provides a method for processing a millimeter wave (mmW) communication signal including selectively combining a first amplified millimeter wave (mmW) signal having a first phase with a second amplified mmW signal having a second phase to provide a transmit signal over a connection; and coupling a mmW receive signal from the connection to an amplifier.

Another aspect of the disclosure provides a device including means for selectively combining a first amplified millimeter wave (mmW) signal having a first phase with a second amplified mmW signal having a second phase to provide a transmit signal over a connection, and means for coupling a mmW receive signal from the connection to an amplifier.

Another aspect of the disclosure provides a phased array element including a transmit phase shifter configured to provide a quadrature signal and an in-phase signal, a main amplifier path configured to provide a quadrature output signal based on the quadrature signal, an auxiliary amplifier path configured to provide an in-phase output signal based on the in-phase signal and a reconfigurable output network configured to generate an equivalent 90 degree (quadrature) phase shift between the quadrature output signal and the in-phase output signal to provide a combined transmit signal.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In a communication system that uses a phased array antenna system having phased array elements that may include both transmit circuitry and receive circuitry, it may be desirable to make the coupling between the transmit circuitry and the antenna and between the receive circuitry and the antenna as low loss as possible while allowing the receive circuitry to provide good noise figure (NF) performance.

In a phased array antenna system it is also desirable to have the ability to provide multiple power levels from the transmit circuitry. A particular power amplifier design that can provide multiple power levels is known as a Doherty power amplifier. A Doherty power amplifier has the advantage of providing good power added efficiency (PAE) at back off power levels, but typically consumes a relatively large amount of area on an integrated circuit because of the use of splitter and combiner circuitry to generate in-phase (I) and quadrature (Q) transmit signals and the need to provide two transmit paths that are separated in phase, typically by 90 degrees.

Therefore, it would be desirable to have a phased array element that can efficiently provide multiple power levels and good receive noise figure performance and that can be incorporated into a millimeter wave integrated circuit (mm-WIC), for example.

In an exemplary embodiment, a phased array element may comprise a reconfigurable Doherty output network that efficiently couples a Doherty power amplifier chain and a low noise amplifier (LNA) in a receive chain to an antenna port.

In an exemplary embodiment, the reconfigurable Doherty output network may comprise circuitry that reduces the capacitance presented to the LNA, while providing an efficient coupling between the Doherty power amplifier chain and the antenna port, and between the LNA and the antenna port.

In an exemplary embodiment, the reconfigurable Doherty output network may comprise circuitry that consumes a small amount of area on the integrated circuit chip, thus also reducing cost.

Figure 1:
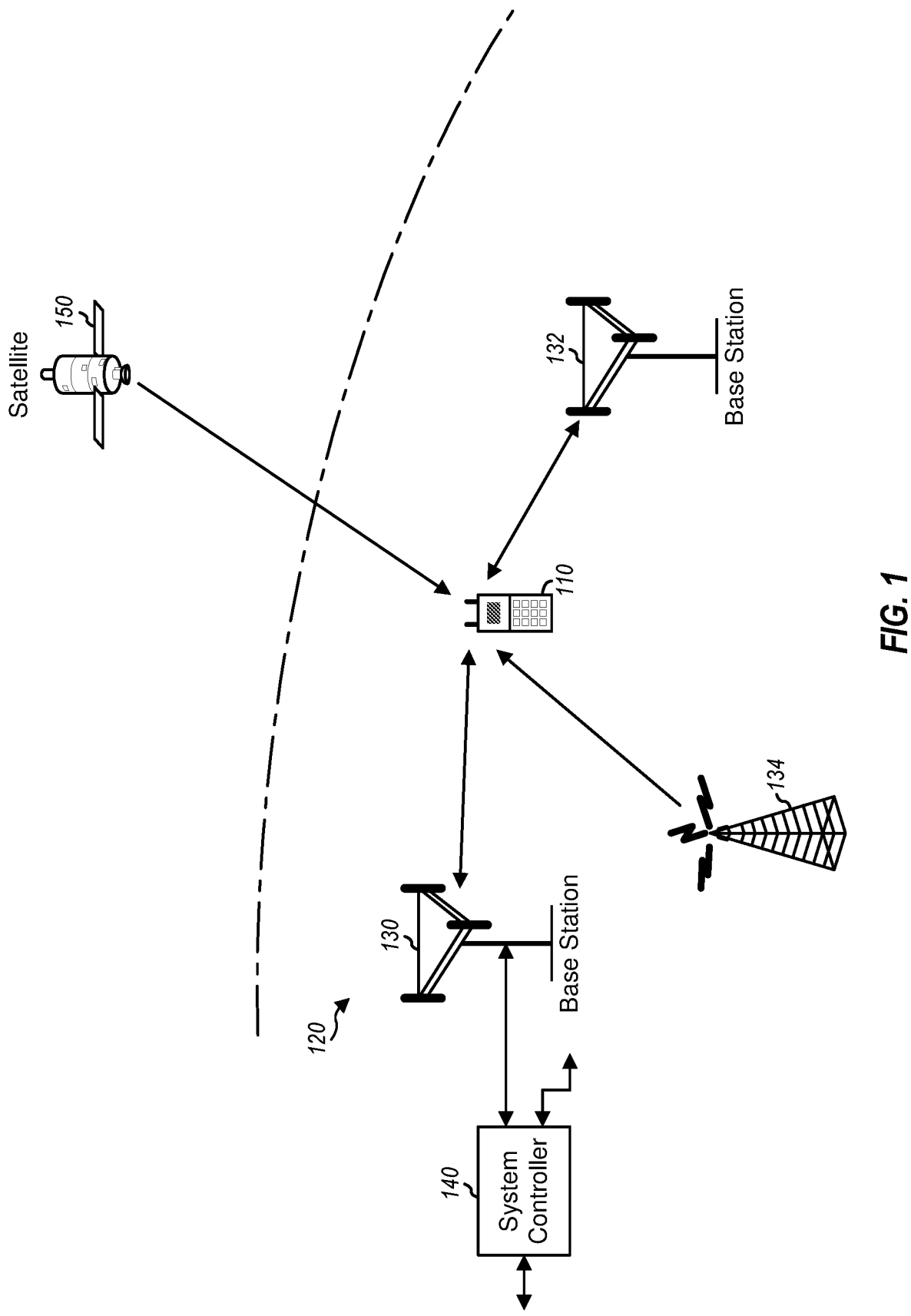
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc.). Wireless device 110 may support one or more radio technologies for wireless communication such as LTE, WCDMA, CDMA 1X, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

Figure 2A:
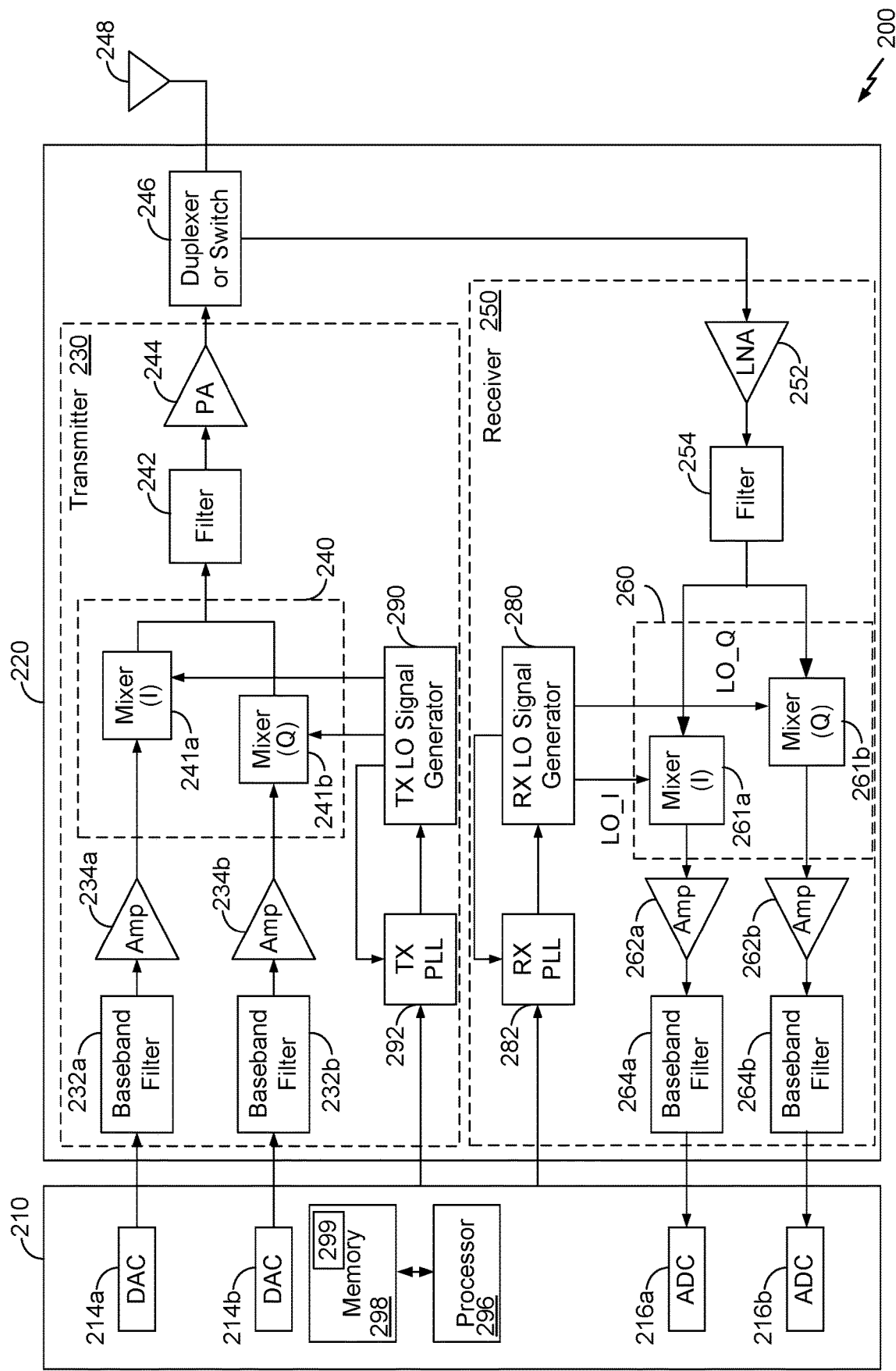
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the reconfigurable Doherty output network described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

Exemplary embodiments of the reconfigurable Doherty output network described herein may be implemented in one or more locations within the power amplifier 244 and/or the filter 242. Exemplary embodiments of the reconfigurable Doherty output network described herein may also be implemented in or as part of the filter 254 and/or the LNA 252 in the receiver 250, or in other locations or components within the transceiver 220.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
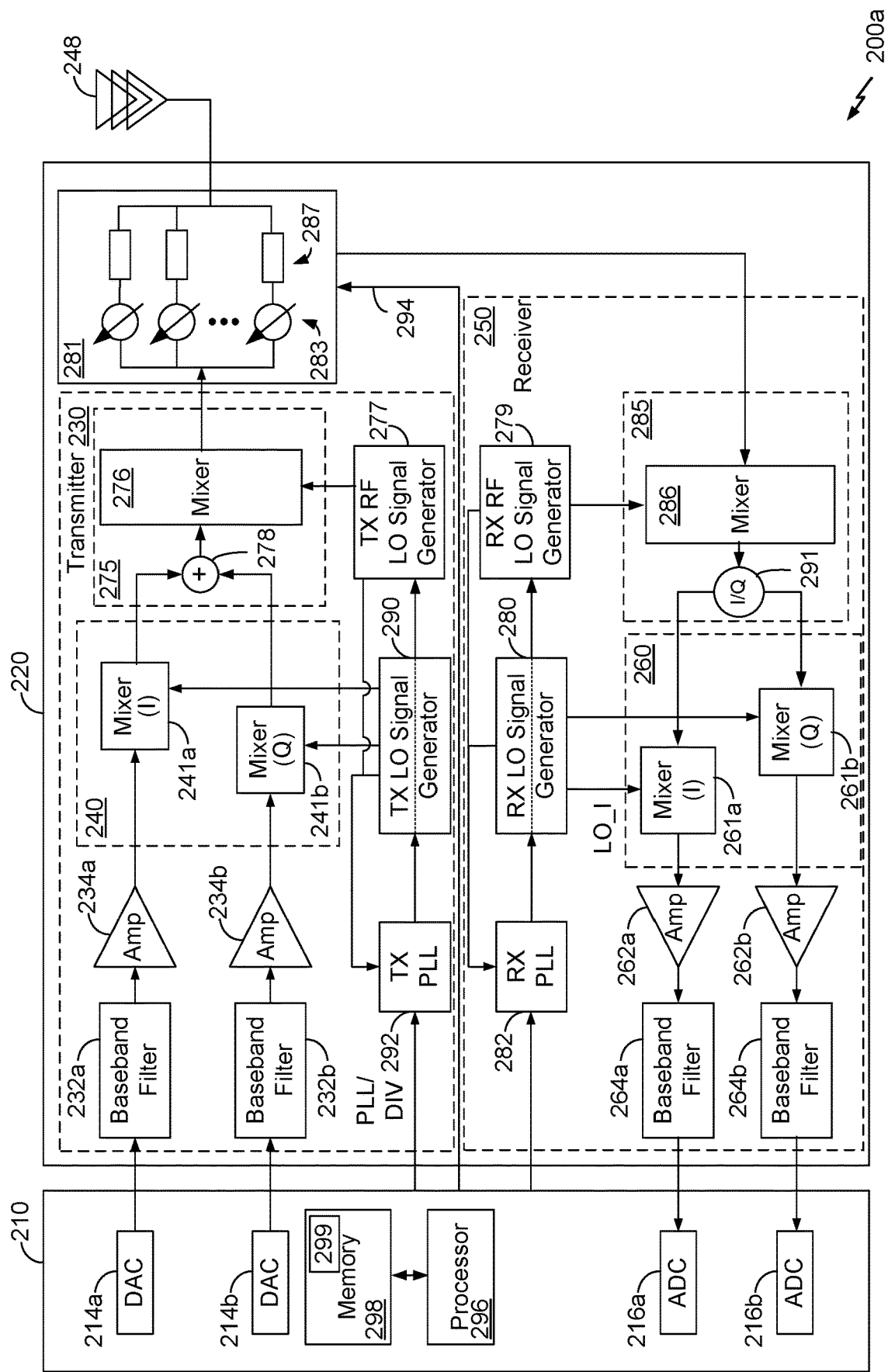
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise summing function 278 and upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise an I/Q generation function 291 and a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 2C:
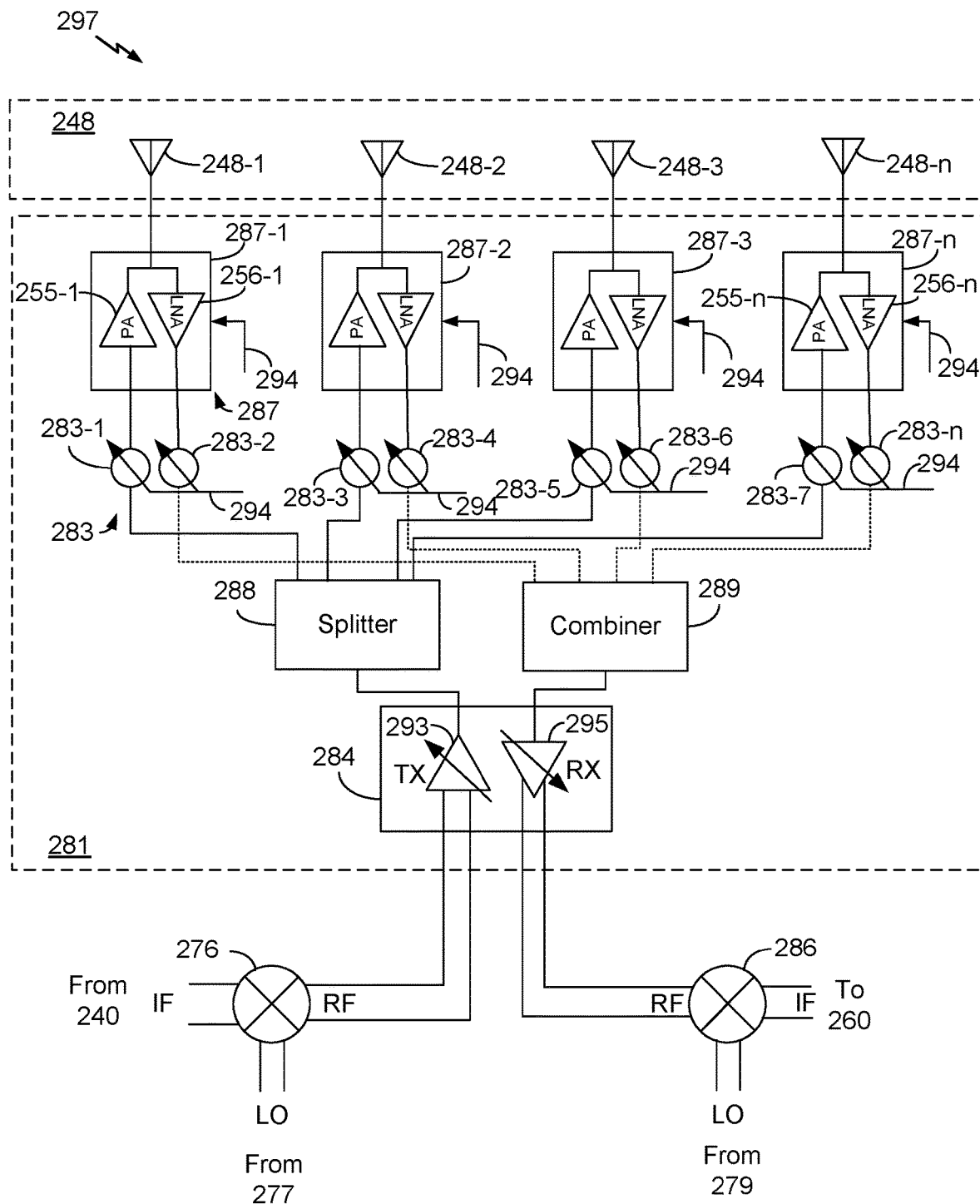
FIG. 2C is a block diagram showing in greater detail some of the components of FIG. 2B.

FIG. 2C is a block diagram 297 showing in greater detail an embodiment of some of the components of FIG. 2B. In an exemplary embodiment, the upconversion mixer 276 provides an RF transmit signal to the phase shift circuitry 281 and the downconversion mixer 286 receives an RF receive signal from the phase shift circuitry 281. In an exemplary embodiment, the phase shift circuitry 281 comprises an RF variable gain amplifier (VGA) 284, a splitter 288, a combiner 289, the phase shifters 283 and the phased array elements 287. In an exemplary embodiment, the phase shift circuitry 281 may be implemented on a millimeter-wave integrated circuit (mmWIC). In some such embodiments, the upconverter 275 and/or the downconverter 285 (or just the mixers 276, 286) are also implemented on the mmWIC. In an exemplary embodiment, the RF VGA 284 may comprise a TX VGA 293 and an RX VGA 295. In some embodiments, the TX VGA 293 and the RX VGA 295 may be implemented independently. In other embodiments, the VGA 284 is bidirectional. In an exemplary embodiment, the splitter 288 and the combiner 289 may be an example of, or may comprise a power distribution network and a power combining network. In some embodiments, the splitter 288 and the combiner 289 may be implemented as a single component or as a separate signal splitter and signal combiner as shown. The phase shifters 283 may be implemented as separate transmit (TX) and receive (RX) phase shifters, or may be implemented as TX/RX bidirectional phase shifters. The phase shifters 283 may be coupled to respective phased array elements 287. In an exemplary embodiment, each phased array element may comprise a power amplifier (PA) 255 and a low noise amplifier (LNA) 256. Each PA 255 may comprise one or more amplifiers or amplifier stages including, for example, one or more driver amplifiers and one or more power amplifiers. Each LNA 256 may comprise one or more amplifiers or amplifier stages. In an exemplary embodiment, a phase shifter 283 may be coupled to a PA 255 and to an LNA 256. Each respective phased array element 287 having a PA 255 and an LNA 256 is coupled to a respective antenna element in the antenna array 248. In an exemplary embodiment, phase shifters 283 and the phased array elements 287 receive control signals from the data processor 210 over connection 294. The exemplary embodiment shown in FIG. 2C comprises a 1×4 array having four TX phase shifters 283-1, 283-3, 283-5 and 283-7; and four RX phase shifters 283-2, 283-4, 283-6 and 283-n; four phased array elements 287-1, 287-2, 287-3 and 287-n, and four antennas 248-1, 248-2, 248-3 and 248-n. However, a 1×4 phased array is shown for example only, and other configurations, such as 1×2, 1×6, 1×8, 2×3, 2×4, or other configurations are possible. Further, each PA 255 and LNA 256 on a phased array element 287 may share a common signal pin to reduce circuit area. However, in other embodiments, each PA 255 and LNA 256 on a phased array element 287 can have an independent pin and employ module routing or use the respective antenna element to couple the Tx path and the Rx path together.

Examples illustrated with respect to FIGS. 2B and 2C implement phase shifting (e.g., using phase shifters 283) in a signal path of the wireless device 200a. In other examples, the phase shifters 283 are omitted, and a phase of a signal may be adjusted by varying a phase at the mixers 276, 286. In some examples, the LO signal generators 277, 279 are configured to provide oscillating signals having varied phase in order to produce TX and/or RX signals having different phases. In some such examples, more than one mixer is implemented for the TX path and/or the RX path in the circuitry 281.

Figure 3:
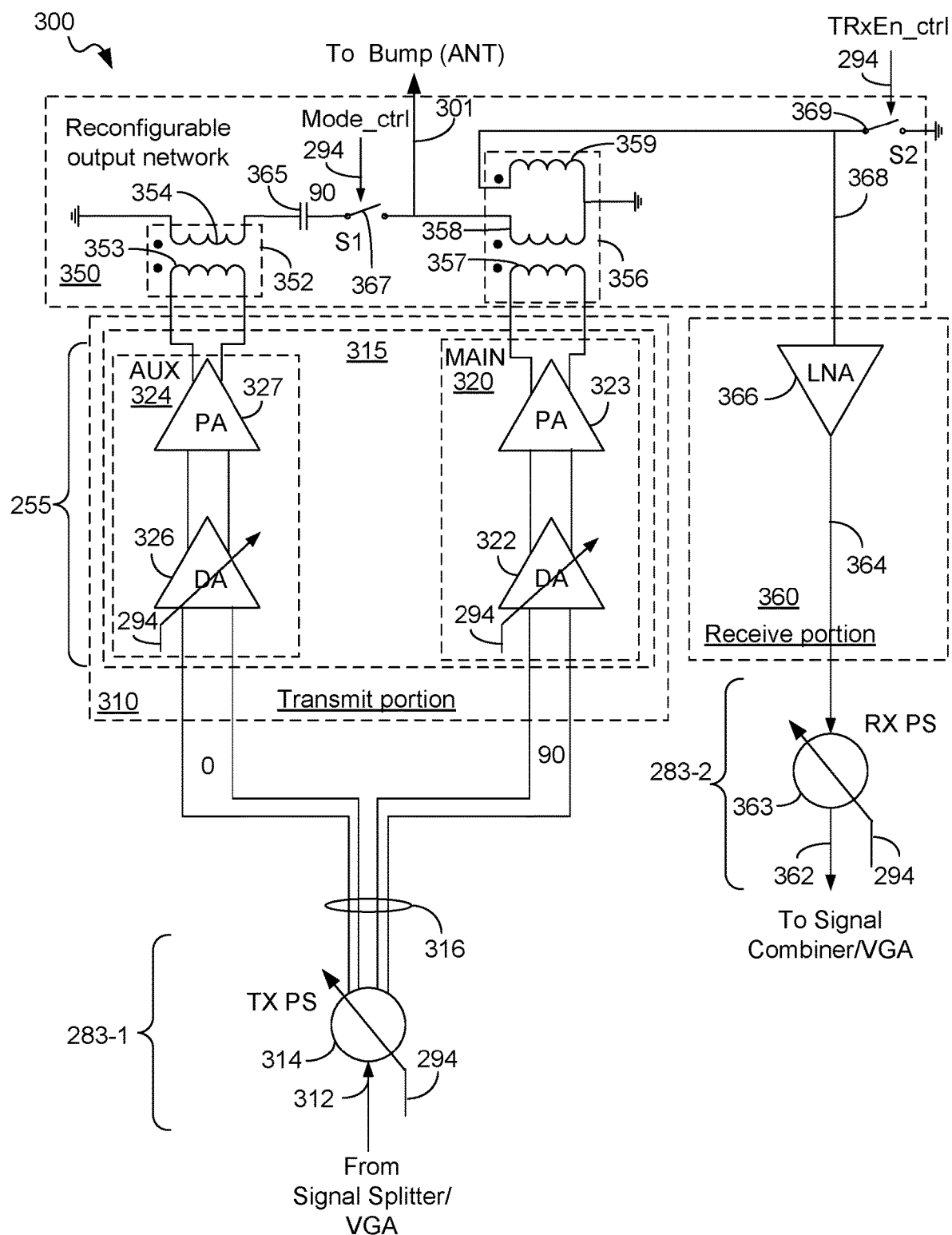
FIG. 3 is a block diagram of a phased array element in accordance with an exemplary embodiment of the disclosure.

FIG. 3 is a block diagram of a phased array element 300 in accordance with an exemplary embodiment of the disclosure. In an exemplary embodiment, the phased array element 300 is an example of a single element that may be implemented in a phased array on a millimeter wave integrated circuit (mmWIC). The phased array element 300 may be an example of any of the phased array elements 287 from FIGS. 2B, 2C.

In an exemplary embodiment, the phased array element 300 may comprise a transmit portion 310, a receive portion 360 and a reconfigurable output network 350. In an exemplary embodiment, the transmit portion 310 may comprise an amplifier 315 that may receive transmit signals from a transmit (TX) phase shifter 314. In an exemplary embodiment, the TX phase shifter 314 may be an example of one of the phase shifters 283 of FIG. 2C. In an exemplary embodiment, the TX phase shifter 314 generates the in-phase (0 degree) and quadrature (90 degree) phase shifted signals for the amplifier 315 so that the amplifier 315 may exhibit Doherty operation, as will be described below. In other embodiments, in-phase and quadrature signals are generated using means other than the phase shifter 314. For example, means that shift signal phase for purposes of beamforming (e.g., at a mixer) may be different from means that produce in-phase and quadrature signals (e.g., a transmission line (for example, quarter wavelength) or network of transmission lines).

In an exemplary embodiment, the TX phase shifter 314 may receive a signal over connection 312 from, for example, the splitter 288 of FIG. 2C, and may provide a phase shifted signal including the in-phase (0 degree) and quadrature (90 degree) phase shifted signals to the amplifier 315. In an exemplary embodiment, the transmit phase shifter 314 may be an example of one of the phase shifters 283 of FIG. 3, such as the phase shifter 283-1 of FIG. 2C. In an exemplary embodiment, the phase shifter 314 may receive a control signal over connection 294 that controls the phase of the transmit signal provided over connection 316 to the amplifier 315. The connection 316 may include multiple connections.

In an exemplary embodiment, the TX phase shifter 314 generates phase offset signals that are provided to the amplifier 315. In an exemplary embodiment, the phase offset signals that are provided to the amplifier 315 may be offset in phase by 90 degrees and may be in-phase (0 degree) and quadrature (90 degree) signals, but are not limited thereto.

In an exemplary embodiment, a receive (RX) phase shifter 363 may receive a signal from the receive portion 360 over connection 364. In an exemplary embodiment, the TX phase shifter 314 may be an example of one of the phase shifters 283-1, 283-2, 283-5 or 283-7 of FIG. 2C; and the RX phase shifter 363 may be an example of one of the phase shifters 283-2, 283-4, 283-6 or 283-n of FIG. 2C.

In an exemplary embodiment, the amplifier 315 may be an example of one of the amplifiers 255 of FIG. 2C. In an exemplary embodiment, the amplifier 315 may be a Doherty power amplifier 315 and the reconfigurable output network 350 may be referred to as reconfigurable Doherty network 350. In an exemplary embodiment, the reconfigurable Doherty network 350 may provide a transceiver interface for the transmit portion 310 and the receive portion 360.

In an exemplary embodiment, the receive portion 360 may comprise a low noise amplifier (LNA) 366, which in an exemplary embodiment may be a one-stage LNA, a two-stage LNA, or any LNA. In an exemplary embodiment, the LNA 366 may be an example of any of the LNAs 256 of FIG. 2C.

An output of the LNA 366 may be provided over connection 364 to the phase shifter 363. The phase shifter 363 may provide a receive signal over connection 362 to a signal combiner, such as the combiner 289 of FIG. 2C. In an exemplary embodiment, the signal on connection 362 may be an RF signal provided to a mixer circuit. In an exemplary embodiment, the phase shifter 363 may receive a control signal over connection 294 that controls the phase of the receive signal provided over connection 362.

In an exemplary embodiment, the Doherty power amplifier 315 may comprise a main amplifier path 320 and an auxiliary amplifier path 324. In an exemplary embodiment, the main amplifier path 320 may comprise a main driver amplifier 322, and a main power amplifier 323. In an exemplary embodiment, the auxiliary amplifier path 324 may comprise an auxiliary driver amplifier 326, and an auxiliary power amplifier 327. More or fewer driver amplifiers and power amplifiers may be implemented in each amplifier path. In some examples, the auxiliary amplifier path 324 may be referred to as a peaking amplifier path and/or the auxiliary power amplifier 327 may be referred to as a peaking amplifier. In an exemplary embodiment, the main driver amplifier 322 and the auxiliary driver amplifier 326 may receive a control signal over connection 294 that controls the gain provided by the main driver amplifier 322 and the auxiliary driver amplifier 326. In an exemplary embodiment, the TX phase shifter 314 provides the in-phase (0 degree) signal to the driver amplifier 326 and provides the quadrature (90 degree) signal to the driver amplifier 322. In other examples, the TX phase shifter 314 provides the in-phase (0 degree) signal to the driver amplifier 322 and provides the quadrature (90 degree) signal to the driver amplifier 326.

In an exemplary embodiment, the reconfigurable output network 350 may comprise a magnetic circuit 352, a magnetic circuit 356, a phase shifting element, such as a capacitance 365, a switch (S1) 367 and a switch (s2) 369.

In an exemplary embodiment, the magnetic circuit 352 may comprise a first inductive element 353 and a second inductive element 354. If the magnetic circuit 352 is implemented as a transformer, then the first inductive element 353 may be a primary side of the transformer and the second inductive element 354 may be a secondary side of the transformer.

In an exemplary embodiment, the magnetic circuit 356 may comprise a first inductive element 357, a second inductive element 358 and a third inductive element 359. If the magnetic circuit 356 is implemented as a transformer (or as a magnetic circuit referred to as a tri-coil), then the first inductive element 357 may be a primary side (or primary coil), the second inductive element 358 may be a secondary side (or secondary coil) and the third inductive element 359 may be a tertiary coil. In an exemplary embodiment, some or all of an input impedance matching function for the LNA 366 may be implemented with the magnetic circuit 356 to reduce the chip area and thus the cost, while minimizing insertion or sensitivity loss for Rx.

In an exemplary embodiment, the output of the main power amplifier 323 may be provided to the first inductive element 357 of the magnetic circuit 356; and the output of the auxiliary power amplifier 327 may be provided to the first inductive element 353 of the magnetic circuit 352.

The second inductive element 354 has a first side coupled to a first side of the capacitance 365 and a second side coupled to system ground. The second side of the capacitance 365 is coupled to a first side of the switch (S1) 367 and the second side of the switch (S1) 367 is selectively coupled to a first side of the second inductive element 358 of the magnetic circuit 356. The first side of the second inductive element 358 is also coupled to the output on connection 301, which may couple to a bump transition and/or an antenna (not shown). For example, the elements illustrated in FIG. 3 may be disposed in an integrated circuit and/or on a chip, and the connection 301 may be coupled to an I/O interface (such as a bump or pin) to the IC/chip. In some examples, the IC/chip is packaged together in a module including one or more antennas. The switch 367 may be controlled by a control signal, Mode_ctrl, over connection 294 from the data processor 210, or another control element.

A second side of the second inductive element 358 is coupled to a first side of the third inductive element 359, which is also coupled to system ground. A second side of the third inductive element 359 is coupled to the LNA 366 over connection 368. The switch (S2) 369 is also coupled between the connection 368 and system ground. The switch (S2) 369 is configured to receive a control signal, TRxEn_ctrl, over connection 294 from the data processor 210 or another controller. In an exemplary embodiment, the switch (S1) 367 and the switch (S2) 369 may comprise a mode control switch circuit.

In an exemplary embodiment in which the switch (S1) 367 is non-conductive, the magnetic circuit 356 may be used to provide a load only for the main power amplifier path 320, thus providing reduced transmit (Tx) parasitics, as well as providing receive (Rx) matching for the LNA 366, through the magnetic coupling between the second inductive element 358 to the third inductive element 359. By carefully selecting the coupling coefficient, as well as the inductance of the third inductive element 359, proper input impedance matching for the LNA 366 can be achieved through the equivalent transformer network comprising the second inductive element 358 and the third inductive element 359, while eliminating an additional or separate inductor at the input to the LNA 366, thus significantly reducing the overall chip area, and also reducing overall cost.

In a receive (Rx) mode, the switch (S1) 367 is selectively controlled to be non-conductive, and the main amplifier path 320 and the auxiliary amplifier path 324 are both off. In Rx mode, the switch (S2) 369 is also selectively controlled to be non-conductive so that the impedance at the input to the LNA 366 is influenced only by the second inductive element 358 and the third inductive element 359.

In a transmit mode, regardless of the output power, the switch (S2) 369 is controlled by the control signal, TRxEn_ctrl, to be conductive, coupling the input of the LNA 366 to system ground, so that the input to the LNA 366 will be protected by minimizing the voltage swing on the third inductive element 359 as a result of the transmit signal provided by the main amplifier path 320. In this example, the switch (S2) 369 may be implemented using a pull down device, such as a pull down transistor, or another device. In receive mode, the switch (S2) 369 is controlled by the control signal, TRxEn_ctrl, to be non-conductive, so that the input impedance provided by the third inductive element 359 (and the second inductive element 358) to the LNA 366 is high. By configuring the switch (S2) 369 into a non-conductive mode, insertion loss from the second inductive element 358 to the third inductive element 359 is reduced, thus reducing receive mode insertion loss and improving the receive mode noise figure.

In a transmit (Tx) high power (HP) mode, the switch (S1) 367 is selectively controlled to be conductive, the switch (S2) 369 is selectively controlled to be conductive, and the main amplifier path 320 and the auxiliary amplifier path 324 are both on. When the main amplifier path 320 and the auxiliary amplifier path 324 are both on and the switch (S1) 367 is selectively controlled to be conductive, the capacitance 365 (in combination with the second inductive element 354, in some examples) provides a phase rotation function so that the 90 degree out-of-phase signals passing through the main amplifier path 320 and the auxiliary amplifier path 324 are combined and appear to be at the same phase when appearing at the connection 301.

This high power (HP) mode may also be referred to as a Prated mode, where the output of the amplifier 315 in this mode reaches its rated output power, within a small range of backoff, such as, for example, −3 dB or −6 dB, etc., when both amplifier paths 320 and 324 are on to deliver the rated output power with good linearity and efficiency.

In a transmit (Tx) low power (LP) mode, the switch (S1) 367 is selectively controlled to be non-conductive, the switch (S2) 369 is selectively controlled to be conductive, the main amplifier path 320 is on and the auxiliary amplifier path 324 is off. This Tx low power (LP) mode may also be referred to as a power backoff mode, where the total output of the amplifier 315 in this mode is lower by a backoff amount, such as by −6 dB, −9 dB or more, etc., than when both amplifier paths 320 and 324 are on. In some examples, the amplifiers in the main amplifier path 320 and auxiliary amplifier path 324 are configured similarly (e.g., are composed of the same elements connected in the same manner, and the elements may be the same size). In other examples, the amplifiers in the main amplifier path 320 and auxiliary amplifier path 324 are configured differently (e.g., having different elements and/or elements of different size). The size and/or design of elements in the magnetic circuit 352 and magnetic circuit 356 (e.g., the inductive elements 353, 354, 357, 358, 359) may vary based on the configuration of the main amplifier path 320 and auxiliary amplifier path 324.

In an exemplary embodiment, for a given target output power, the ability to separate the main amplifier path 320 and the auxiliary amplifier path 324 using the switch (S1) 367 significantly reduces receive mode loading to the receive portion 360 because there is only one amplifier path (the main amplifier path 320) coupled to the magnetic circuit 356 in low power transmit mode, or in receive mode.

Figure 4:
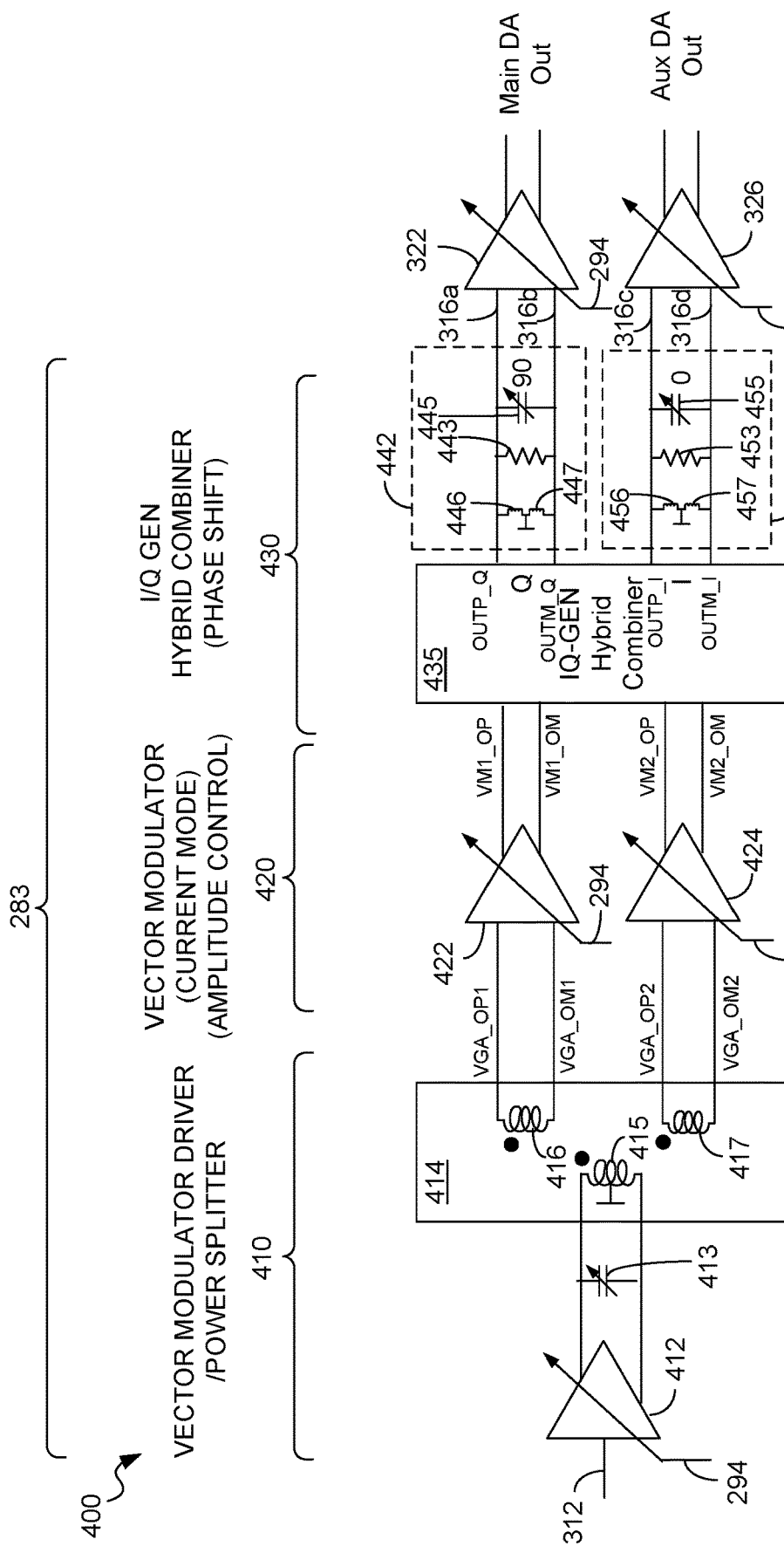
FIG. 4 is a block diagram showing a shared hybrid combiner/splitter having a current mode vector modulator.

FIG. 4 is a block diagram of a phase shift circuit 400. In an exemplary embodiment, the phase shift circuit 400 shows an implementation of the phase shifter 283 of FIG. 2C, and shows an implementation of the TX phase shifter 314 of FIG. 3.

In an exemplary embodiment, the phase shift circuit 400 comprises a vector modulator driver (VMDR)/power splitter 410, a vector modulator 420, and an I/Q generator and hybrid combiner 430. The driver amplifier 322 (FIG. 3) and driver amplifier 326 (FIG. 3) are shown for reference.

In an exemplary embodiment, the vector modulator driver (VMDR)/power splitter 410 comprises a variable gain amplifier (VGA) 412 and a power splitter 414. The VGA 412 may receive the output of the splitter 288 (FIG. 2C) over connection 312 (FIG. 3). The VGA 412 may be a phase immune VGA where the output phase remains constant as the gain provided by the VGA 412 changes. In an exemplary embodiment, the VGA 412 may receive a control signal over connection 294 that controls the gain provided by the VGA 412. A capacitance 413 (which may be adjustable) is located across the outputs of the VGA 412.

In an exemplary embodiment, the power splitter 414 may comprise a VGA power splitter implemented using, for example, inductive coils 415, 416 and 417. In an exemplary embodiment, a transmit signal provided to the inductive coil 415 is divided, or split, so that the transmit signal appears on the inductive coil 416 and on the inductive coil 417. In an exemplary embodiment, VGA output signals, VGA_OP1 and VGA_OM1 appear on the inductive coil 416 and VGA output signals, VGA_OP2 and VGA_OM2 appear on the inductive coil 417. The nomenclature "P" refers to positive (P) polarity and the nomenclature "M" refers to negative (M, minus) polarity of differential signals. In an exemplary embodiment, the power splitter 414 is configured to divide (or split) the transmit signal to provide amplified transmit signals to the vector modulator 420. In an exemplary embodiment, the VGA 412 and the power splitter 414 generate signals having the same phase.

In an exemplary embodiment, the vector modulator 420 may comprise a variable gain amplifier 422 and a variable gain amplifier 424 configured to provide amplitude control. In an exemplary embodiment, the VGA 422 and the VGA 424 may receive a control signal over connection 294 that controls the gain provided by the VGA 422 and the VGA 424. In an exemplary embodiment, the vector modulator 420 may be configured to perform current mode vector modulation, and also provide amplitude control for the signals provided by the power splitter 414. In an exemplary embodiment, the VGA 422 provides current mode output signals VM1_OP and VM1_OM and the VGA 424 provides current mode output signals VM2_OP and VM2_OM.

In an exemplary embodiment, the outputs of the amplifiers 422 and 424 are provided to the I/Q generator and hybrid combiner 430. In an exemplary embodiment, the I/Q generator and hybrid combiner 430 may include an I/Q generator and combiner circuit 435, a tuning circuit 442 and a tuning circuit 452.

In an exemplary embodiment, the I/Q generator and combiner circuit 435 generates in-phase (I) signal outputs OUTP_I and OUT_M_I and quadrature (Q) signal outputs OUTP_Q, OUTM_Q. In an exemplary embodiment, the quadrature (Q) output signals are provided to the tuning circuit 442 and the in-phase (I) output signals are provided to the tuning circuit 452. In an exemplary embodiment, the tuning circuit 442 forms part of a 90 degree offset path for the quadrature (Q) signal outputs and the tuning circuit 452 forms part of a 0 degree offset path for the in-phase (I) signal outputs. In an exemplary embodiment, the 0 degree in-phase (I) outputs of the I/Q generator and hybrid combiner 435 are provided to the auxiliary driver amplifier 326 over connections 316c and 316d; and the 90 degree quadrature (Q) outputs of the I/Q generator and hybrid combiner 435 are provided to the auxiliary driver amplifier 322 over connections 316a and 316b. In an exemplary embodiment, the main driver amplifier 322 and the auxiliary driver amplifier 326 may receive a control signal over connection 294 that controls the gain provided by the main driver amplifier 322 and the auxiliary driver amplifier 326.

In an exemplary embodiment, the tuning circuit 442 may comprise a resistance 443, an adjustable capacitance 445, and inductances 446 and 447. In an exemplary embodiment, the tuning circuit 452 may comprise a resistance 453, an adjustable capacitance 455, and inductances 456 and 457. The tuning circuits 442 and 452 may improve Doherty operation quality for improved power added efficiency (PAE) in some examples, and may be omitted in other examples.

The phase shift circuit 400 provides chip area reduction by re-using the signal path phase shifters 283 (FIG. 2C) from the phased array system to provide the offset phase signals for Doherty power amplifier operation.

Figure 5:
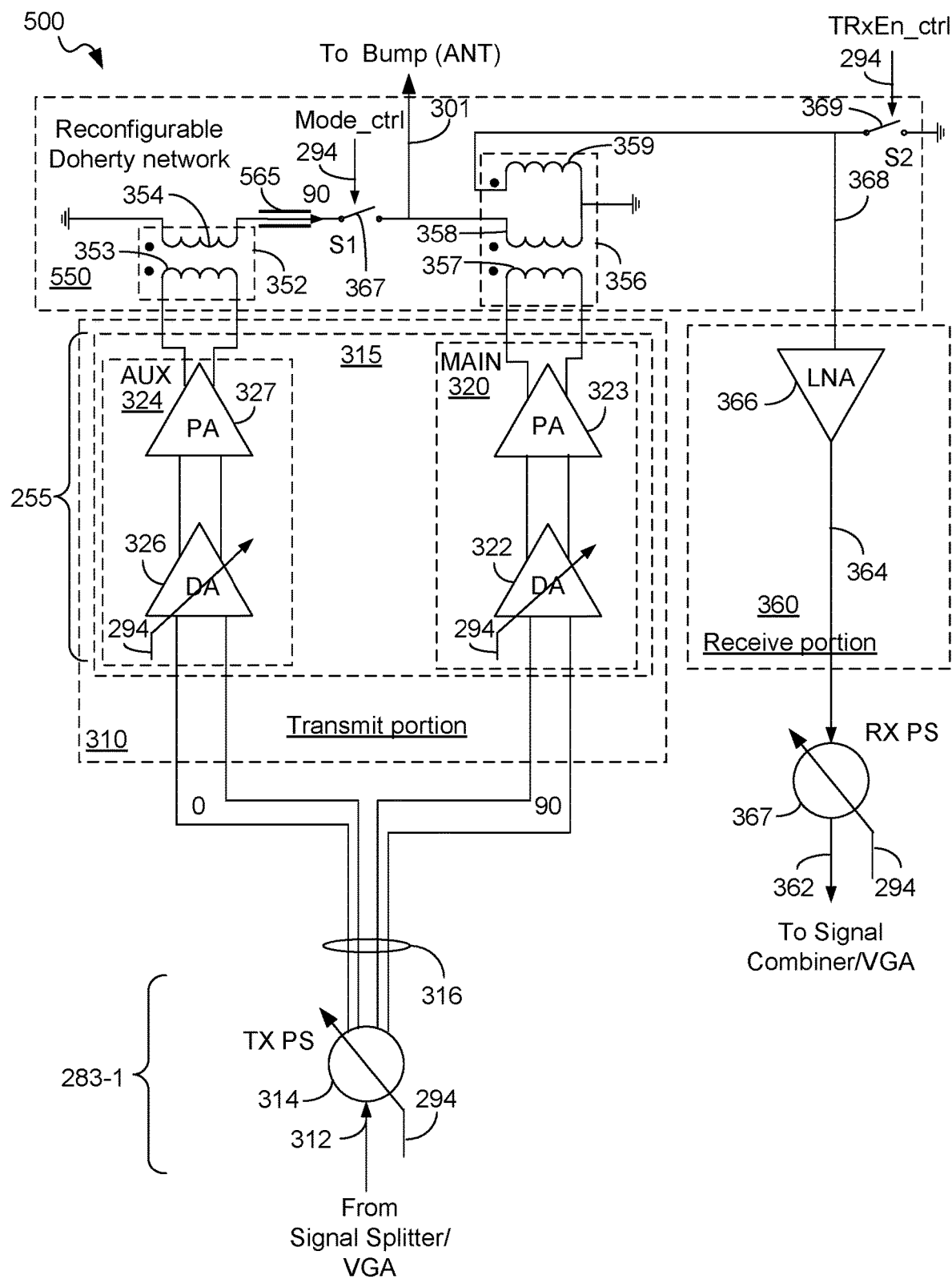
FIG. 5 is a block diagram of a phased array element in accordance with an exemplary embodiment of the disclosure.

FIG. 5 is a block diagram of a phased array element 500 in accordance with an exemplary embodiment of the disclosure. Elements which are identical in the phased array element 500 and the phased array element 300 described in FIG. 3 are identically numbered and the description thereof will not be repeated.

In an exemplary embodiment, the phased array element 500 comprises a reconfigurable Doherty network 550 having a transmission line 565 instead of the capacitance 365 shown in FIG. 3. The transmission line 565 provides a similar amount of phase rotation (or phase shift) provided by the capacitance 365 in FIG. 3. In a transmit (Tx) high power (HP) mode, the switch (S1) 367 is selectively controlled to be conductive, and the main amplifier path 320 and the auxiliary amplifier path 324 are both on. When the main amplifier path 320 and the auxiliary amplifier path 324 are both on and the switch (S1) 367 is selectively controlled to be conductive, the transmission line 565 provides a phase rotation function so that the 90 degree out-of-phase signals passing through the main amplifier path 320 and the auxiliary amplifier path 324 are combined to be at the same phase when appearing at the connection 301. In some examples, the phase shifting element (e.g., the capacitance 365 or the transmission line 565) and the switch (S1) 367 comprise a selectable output circuit.

In an exemplary embodiment, the transmission line 565 may be located on chip (e.g., on the same chip or in the same IC as the other components illustrated in FIG. 5) or off chip (for example, when the chip or IC is packaged together with one or more antennas in a module, the transmission line may be implemented on a printed circuit board, within the module, to which the IC or chip is attached).

In an exemplary embodiment, any parasitics introduced by the switch (S1) 367 will be absorbed in the transmission line 565, thus minimizing any loss and also improving PAE.

In an exemplary embodiment, the two magnetic circuits 352 and 356 can be independently optimized, e.g., for I/Q phase orthogonality and to minimize loss.

In an exemplary embodiment, compared to a legacy power amplifier without a Doherty output network, where the power amplifier includes a single amplifier path, using a Doherty power amplifier arrangement as described herein with the reconfigurable Doherty network 350 (550) improves the Rx noise figure and provides a significant reduction in power amplifier loading, while providing similar rated power.

In an exemplary embodiment, the reconfigurable Doherty network 350 (550) having a separate magnetic circuit for each amplification path allows the tri-coil magnetic circuit 356 to introduce fewer parasitics and to lower loss.

In an exemplary embodiment, the Doherty configuration of the amplifier 315 improves transmit efficiency at power backoff (e.g., Prated power to Prated −6 dB or −9 dB power).

In an exemplary embodiment, the Doherty configuration of the amplifier 315 provides improved PAE at Prated −6 dB power by enabling classic Doherty operation to improve back off efficiency.

In an exemplary embodiment, the Doherty configuration of the amplifier 315 allows a further power reduction at lower output ranges by having the ability to completely turn off the auxiliary amplifier path 324.

In an exemplary embodiment, the amount of area consumed by the phased array element 300 (500) may be reduced because the vector modulator driver (VMDR)/power splitter 410, the vector modulator 420, and the I/Q signal generator and hybrid combiner 430 may be implemented as the signal path phase shifter 283 (FIG. 2C), while also providing the 90 degree offset phase signals for Doherty power amplifier operation.

Figure 6:
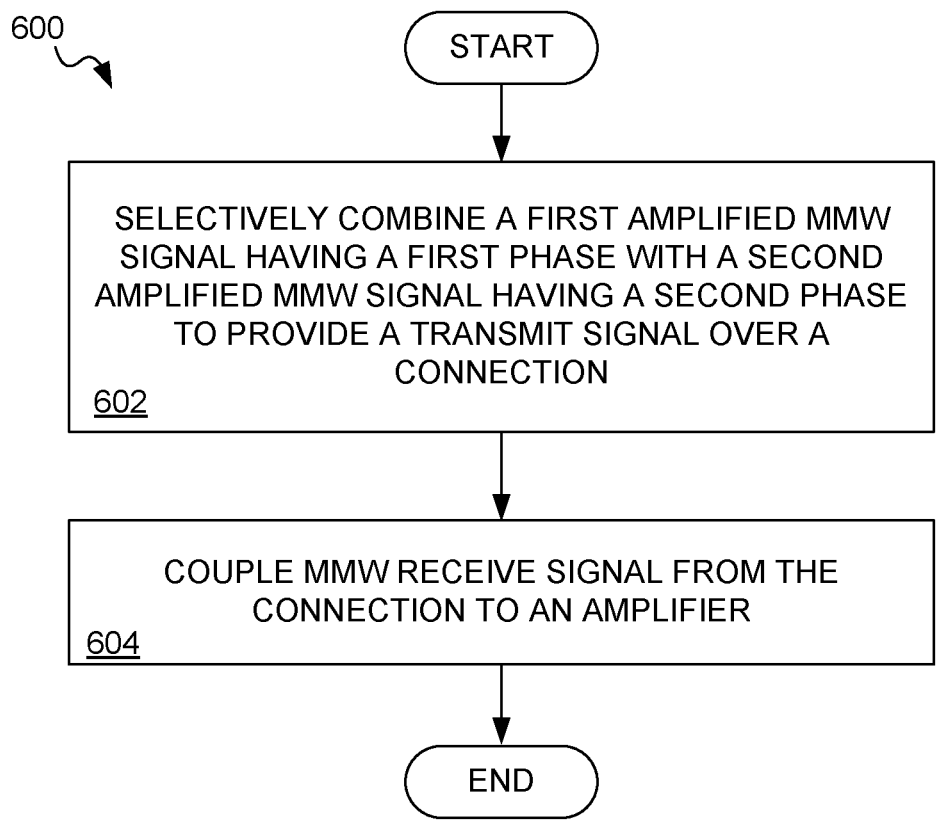
FIG. 6 is a flow chart describing an example of the operation of a method for signal passage.

FIG. 6 is a flow chart 600 describing an example of the operation of a method for signal passage. The blocks in the method 600 can be performed in or out of the order shown, and in some embodiments, can be performed at least in part in parallel.

In block 602, a first amplified mmW signal having a first phase is selectively combined with a second amplified mmW signal having a second phase to provide a transmit signal over a connection. For example, the output of the main power amplifier 323 having a phase of 90 degrees (quadrature signal) may be combined at connection 301 with the output of the auxiliary power amplifier having a phase of 0 degrees (in-phase signal) by phase shifting the output of the auxiliary power amplifier 90 degrees (e.g., using the capacitor 365 or the transmission line 565) when the switch (S1) is closed.

In block 604, a mmW receive signal is coupled from the connection to an amplifier (e.g., a low noise amplifier). For example, a receive signal at the connection 301 may be provided to the third inductive element 359 (tertiary coil) so that the receive signal appears at connection 368 at the input of the LNA 366.

Figure 7:
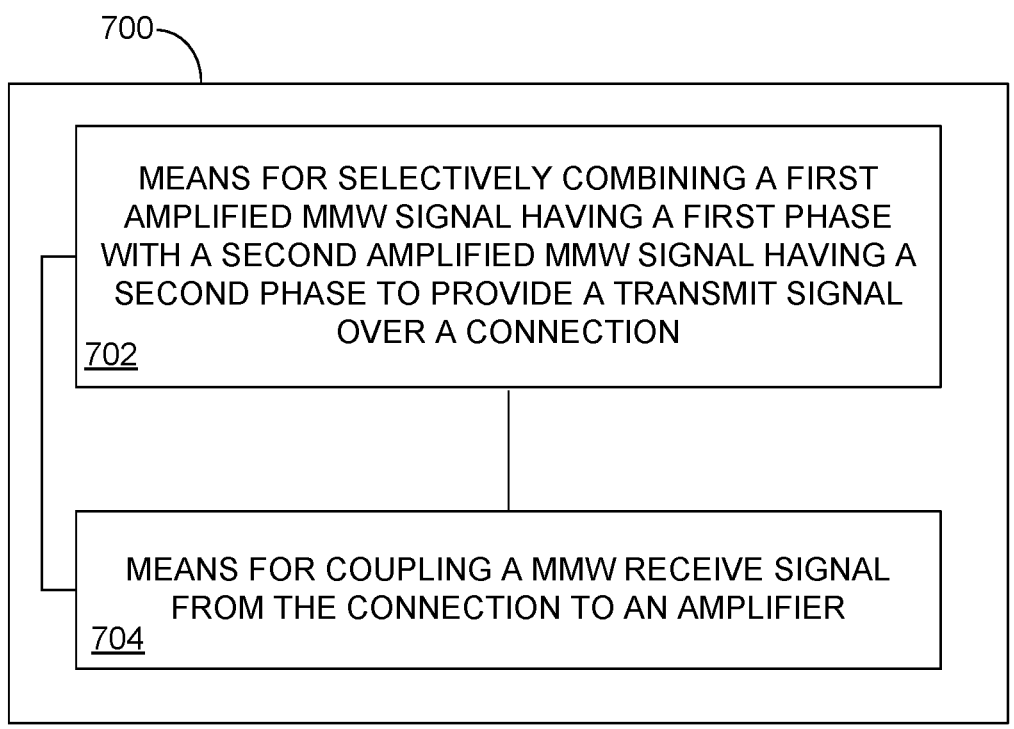
FIG. 7 is a functional block diagram of an apparatus for signal passage.

FIG. 7 is a functional block diagram of an apparatus for signal passage. The apparatus 700 comprises means 702 for selectively combining a first amplified mmW signal having a first phase with a second amplified mmW signal having a second phase to provide a transmit signal over a connection. In certain embodiments, the means 702 for selectively combining can be configured to perform one or more of the functions described in operation block 602 of method 600 (FIG. 6). In an exemplary embodiment, the means 702 for selectively combining may comprise the capacitor 365, the transmission line 565, the magnetic circuit 352, the magnetic circuit 356 (or portions thereof), and/or the switch 367, which may be configured to phase shift the output of the auxiliary power amplifier 327 (which has a phase of 0 degrees, e.g., an in-phase signal) with the output of the main power amplifier 323 (which has a phase of 90 degrees, e.g., a quadrature signal) to provide a transmit signal to connection 301 when the switch (S1) 367 is closed.

Implementation examples are described in the following numbered clauses:

1. A transceiver interface for a phased array element, comprising: a first magnetic circuit having a primary coil and a secondary coil; a second magnetic circuit having a primary coil, a secondary coil and a tertiary coil; a main amplifier path and an auxiliary amplifier path, the main amplifier path coupled to the primary coil of the second magnetic circuit and configured to receive a quadrature signal, the main amplifier path configured to provide a quadrature output signal, the auxiliary amplifier path coupled to the primary coil of the first magnetic circuit and configured to receive an in-phase signal, the auxiliary amplifier path configured to provide an in-phase output signal; a selectable output circuit configured to selectively combine the in-phase output signal and the quadrature output signal; and a low noise amplifier (LNA) coupled to the tertiary coil of the second magnetic circuit.

2. The transceiver interface of clause 1, wherein the selectable output circuit comprises a capacitance configured to generate an equivalent 90 degree (quadrature) phase shift between the main amplifier path quadrature output signal and the auxiliary amplifier path in-phase output signal.

3. The transceiver interface of clause 1, wherein the selectable output circuit comprises a transmission line configured to generate an equivalent 90 degree (quadrature) phase shift between the main amplifier path quadrature output signal and the auxiliary amplifier path in-phase output signal.

4. The transceiver interface of any of clauses 1 through 3, wherein the main amplifier path and the auxiliary amplifier path comprise a Doherty amplifier.

5. The transceiver interface of any of clauses 1 through 4, wherein a Tx mode of the transceiver interface comprises a Tx low power (LP) mode and a Tx high power (HP) mode and an impedance presented to the LNA in the Tx low power mode and in a receive (Rx) mode is influenced only by the main amplifier path.

6. The transceiver interface of any of clauses 1 through 5, further comprising a phase shifter configured to provide a phase shift for phased array operation and that outputs the in-phase signal and the quadrature signal.

7. The transceiver interface of any of clauses 1 through 6, wherein the phase shifter comprises: a variable gain amplifier (VGA); a power splitter coupled to the VGA; a current mode modulator coupled to the power splitter; and an in-phase/quadrature generator and combiner configured to generate the in-phase signal and the quadrature signal for the auxiliary amplifier path and the main amplifier path based on signals output from the current mode modulator.

8. The transceiver interface of any of clauses 1 through 7, further comprising a mode control switch circuit having a first switch and a second switch, the mode control switch circuit configured to select between a transmit (Tx) mode and a receive (Rx) mode, to control an impedance presented to the LNA in the Tx mode.

9. The transceiver interface of any of clauses 1 through 8, wherein the first switch is selectively controlled to be non-conductive and the second magnetic circuit is configured to provide a load only for the main amplifier path and configured to provide receive (Rx) impedance matching for the LNA.

10. The transceiver interface of any of clauses 1 through 9, wherein in the Tx mode, the second switch is selectively controlled to be conductive, coupling an input of the LNA to system ground.

11. A method for processing millimeter wave (mmW) communication signals, comprising: selectively combining a first amplified millimeter wave (mmW) signal having a first phase with a second amplified mmW signal having a second phase to provide a transmit signal over a connection; and coupling a mmW receive signal from the connection to an amplifier.

12. The method of clause 11, wherein the selectively combining generates an equivalent 90 degree (quadrature) phase shift between a main amplifier path and an auxiliary amplifier path.

13. The method of any of clauses 11 through 12, wherein the selectively combining comprises combining an in-phase signal with a quadrature signal for Doherty amplifier operation.

14. The method of any of clauses 11 through 13, further comprising: generating at least one of a transmit (Tx) low power (LP) mode and a Tx high power (HP) mode; and presenting an impedance to a low noise amplifier (LNA) in the Tx low power mode and in a receive (Rx) mode that is influenced only by a main amplifier path.

15. The method of any of clauses 11 through 14, further comprising coupling an input of the LNA to system ground in the Tx LP mode and the Tx HP mode so that the input to the LNA experiences minimal voltage swing.

16. The method of any of clauses 11 through 15, further comprising: providing a load only for the main amplifier path; and providing receive (Rx) impedance matching for the LNA.

17. A device, comprising: means for selectively combining a first amplified millimeter wave (mmW) signal having a first phase with a second amplified mmW signal having a second phase to provide a transmit signal over a connection; and means for coupling a mmW receive signal from the connection to an amplifier.

18. The device of clause 17, wherein the means for selectively combining comprise means for generating an equivalent 90 degree (quadrature) phase shift between a main amplifier path and an auxiliary amplifier path.

19. The device of any of clauses 17 through 18, wherein the means for selectively combining comprise means for combining an in-phase signal with a quadrature signal for Doherty amplifier operation.

20. The device of any of clauses 17 through 19, further comprising: means for generating at least one of a transmit (Tx) low power (LP) mode and a Tx high power (HP) mode; and means for presenting an impedance to the amplifier in the Tx low power mode and in a receive (Rx) mode that is influenced only by a main amplifier path.

21. The device of any of clauses 17 through 20, further comprising: means for coupling an input of the amplifier to system ground in the Tx LP mode and the Tx HP mode so that the input to the amplifier experiences minimal voltage swing.

22. The device of any of clauses 17 through 21, further comprising: means for providing a load only for the main amplifier path; and means for providing receive (Rx) impedance matching for the amplifier.

23. A phased array element, comprising: a transmit phase shifter configured to provide a quadrature signal and an in-phase signal; a main amplifier path configured to provide a quadrature output signal based on the quadrature signal; an auxiliary amplifier path configured to provide an in-phase output signal based on the in-phase signal; and a reconfigurable output network configured to generate an equivalent 90 degree (quadrature) phase shift between the quadrature output signal and the in-phase output signal to provide a combined transmit signal.

24. The phased array element of clause 23, wherein the reconfigurable output network comprises a capacitance configured to generate the equivalent 90 degree (quadrature) phase shift between the main amplifier path quadrature output signal and the auxiliary amplifier path in-phase output signal.

25. The phased array element of clause 23, wherein the reconfigurable output network comprises a transmission line configured to generate the equivalent 90 degree (quadrature) phase shift between the main amplifier path quadrature output signal and the auxiliary amplifier path in-phase output signal.

26. The phased array element of any of clauses 23 through 25, wherein the main amplifier path and the auxiliary amplifier path comprise a Doherty amplifier.

27. The phased array element of any of clauses 23 through 26, wherein a Tx mode comprises a Tx low power (LP) mode and a Tx high power (HP) mode and an impedance presented to a low noise amplifier (LNA) coupled to the reconfigurable output network in the Tx low power mode and in a receive (Rx) mode is influenced only by the main amplifier path.

28. The phased array element of any of clauses 23 through 27, comprising: a mode control switch circuit having a first switch and a second switch, the mode control switch circuit configured to select between a transmit (Tx) mode and a receive (Rx) mode, to control an impedance presented to a low noise amplifier (LNA) coupled to the reconfigurable output network in the Tx mode.

29. The phased array element of any of clauses 23 through 28, wherein in the Tx mode, the second switch is selectively controlled to be conductive, coupling an input of the LNA to system ground.

30. The phased array element of any of clauses 23 through 29, wherein the reconfigurable output network comprises a first magnetic circuit having a primary coil and a secondary coil, and a second magnetic circuit having a primary coil, a secondary coil and a tertiary coil, and wherein the first switch is selectively controllable to be non-conductive and the second magnetic circuit is configured to provide a load only for the main amplifier path and configured to provide receive (Rx) impedance matching for the LNA.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A transceiver interface for a phased array element, comprising:
    a first magnetic circuit having a primary coil and a secondary coil;
    a second magnetic circuit having a primary coil, a secondary coil and a tertiary coil;
    a main amplifier path and an auxiliary amplifier path, the main amplifier path coupled to the primary coil of the second magnetic circuit and configured to receive a quadrature signal, the main amplifier path configured to provide a quadrature output signal, the auxiliary amplifier path coupled to the primary coil of the first magnetic circuit and configured to receive an in-phase signal, the auxiliary amplifier path configured to provide an in-phase output signal;
    a selectable output circuit configured to selectively combine the in-phase output signal and the quadrature output signal; and
    a low noise amplifier (LNA) coupled to the tertiary coil of the second magnetic circuit.

2. The transceiver interface of claim 1, wherein the selectable output circuit comprises a capacitance configured to generate an equivalent 90 degree (quadrature) phase shift between the main amplifier path quadrature output signal and the auxiliary amplifier path in-phase output signal.

3. The transceiver interface of claim 1, wherein the selectable output circuit comprises a transmission line configured to generate an equivalent 90 degree (quadrature) phase shift between the main amplifier path quadrature output signal and the auxiliary amplifier path in-phase output signal.

4. The transceiver interface of claim 1, wherein the main amplifier path and the auxiliary amplifier path comprise a Doherty amplifier.

5. The transceiver interface of claim 1, wherein a Tx mode of the transceiver interface comprises a Tx low power (LP) mode and a Tx high power (HP) mode and an impedance presented to the LNA in the Tx low power mode and in a receive (Rx) mode is influenced only by the main amplifier path.

6. The transceiver interface of claim 1, further comprising a phase shifter configured to provide a phase shift for phased array operation and that outputs the in-phase signal and the quadrature signal.

7. The transceiver interface of claim 6, wherein the phase shifter comprises:
    a variable gain amplifier (VGA);
    a power splitter coupled to the VGA;
    a current mode modulator coupled to the power splitter; and
    an in-phase/quadrature generator and combiner configured to generate the in-phase signal and the quadrature signal for the auxiliary amplifier path and the main amplifier path based on signals output from the current mode modulator.

8. The transceiver interface of claim 6, further comprising a mode control switch circuit having a first switch and a second switch, the mode control switch circuit configured to select between a transmit (Tx) mode and a receive (Rx) mode, to control an impedance presented to the LNA in the Tx mode.

9. The transceiver interface of claim 8, wherein the first switch is selectively controlled to be non-conductive and the second magnetic circuit is configured to provide a load only for the main amplifier path and configured to provide receive (Rx) impedance matching for the LNA.

10. The transceiver interface of claim 8, wherein in the Tx mode, the second switch is selectively controlled to be conductive, coupling an input of the LNA to system ground.

11. A phased array element, comprising:
    a transmit phase shifter configured to provide a quadrature signal and an in-phase signal;
    a main amplifier path configured to provide a quadrature output signal based on the quadrature signal;
    an auxiliary amplifier path configured to provide an in-phase output signal based on the in-phase signal; and
    a reconfigurable output network configured to generate an equivalent 90 degree (quadrature) phase shift between the quadrature output signal and the in-phase output signal to provide a combined transmit signal, wherein a Tx mode comprises a Tx low power (LP) mode and a Tx high power (HP) mode and an impedance presented to a low noise amplifier (LNA) coupled to the reconfigurable output network in the Tx low power mode and in a receive (Rx) mode is influenced only by the main amplifier path.

12. The phased array element of claim 11, wherein the reconfigurable output network comprises a capacitance configured to generate the equivalent 90 degree (quadrature) phase shift between the main amplifier path quadrature output signal and the auxiliary amplifier path in-phase output signal.

13. The phased array element of claim 11, wherein the reconfigurable output network comprises a transmission line configured to generate the equivalent 90 degree (quadrature) phase shift between the main amplifier path quadrature output signal and the auxiliary amplifier path in-phase output signal.

14. The phased array element of claim 11, wherein the main amplifier path and the auxiliary amplifier path comprise a Doherty amplifier.

15. A phased array element, comprising:
    a transmit phase shifter configured to provide a quadrature signal and an in-phase signal;
    a main amplifier path configured to provide a quadrature output signal based on the quadrature signal;
    an auxiliary amplifier path configured to provide an in-phase output signal based on the in-phase signal;
    a reconfigurable output network configured to generate an equivalent 90 degree (quadrature) phase shift between the quadrature output signal and the in-phase output signal to provide a combined transmit signal; and
    a mode control switch circuit having a first switch and a second switch, the mode control switch circuit configured to select between a transmit (Tx) mode and a receive (Rx) mode, to control an impedance presented to a low noise amplifier (LNA) coupled to the reconfigurable output network in the Tx mode.

16. The phased array element of claim 15, wherein in the Tx mode, the second switch is selectively controlled to be conductive, coupling an input of the LNA to system ground.

17. The phased array element of claim 15, wherein the reconfigurable output network comprises a first magnetic circuit having a primary coil and a secondary coil, and a second magnetic circuit having a primary coil, a secondary coil and a tertiary coil, and wherein the first switch is selectively controllable to be non-conductive and the second magnetic circuit is configured to provide a load only for the main amplifier path and configured to provide receive (Rx) impedance matching for the LNA.

* * * * *